(12) United States Patent
Dvorak et al.

(10) Patent No.: US 10,505,308 B1
(45) Date of Patent: Dec. 10, 2019

(54) DUAL CUP ENCLOSURE FOR ELECTRONIC DEVICES

(71) Applicant: Apple Inc., Cupertino, CA (US)

(72) Inventors: Peter A. Dvorak, Menlo Park, CA (US); Joshua K. Anderson, Sunnyvale, CA (US); Michael A. Foote, Santa Clara, CA (US); Christopher J. Pawlowski, Emerald Hills, CA (US); Ross C. Heyman, Belmont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/127,056

(22) Filed: Sep. 10, 2018

Related U.S. Application Data

(60) Provisional application No. 62/678,684, filed on May 31, 2018.

(51) Int. Cl.
| | |
|---|---|
| *H01R 13/504* | (2006.01) |
| *H02M 7/00* | (2006.01) |
| *H01R 43/18* | (2006.01) |
| *H05K 5/02* | (2006.01) |
| *H01R 31/06* | (2006.01) |
| *H05K 5/03* | (2006.01) |

(52) U.S. Cl.
CPC ......... *H01R 13/504* (2013.01); *H01R 31/065* (2013.01); *H01R 43/18* (2013.01); *H02M 7/003* (2013.01); *H05K 5/0217* (2013.01); *H05K 5/03* (2013.01)

(58) Field of Classification Search
CPC ..... H01R 13/504; H01R 31/065; H01R 43/18
USPC .................................................. 439/620.21
See application file for complete search history.

(56) References Cited

U.S. PATENT DOCUMENTS

| | | | | |
|---|---|---|---|---|
| 4,737,124 A | * | 4/1988 | Ezure .................... | H01R 23/26 439/585 |
| 5,647,751 A | * | 7/1997 | Shulman .............. | H01R 13/504 439/106 |
| 6,262,365 B1 | * | 7/2001 | Ewer .................... | H02G 3/0608 174/491 |
| 6,472,596 B1 | * | 10/2002 | DeBartolo ........... | H02G 3/0608 174/480 |

(Continued)

FOREIGN PATENT DOCUMENTS

| | | |
|---|---|---|
| EP | 2613618 A1 | 7/2013 |
| EP | 2822014 A1 | 1/2015 |

OTHER PUBLICATIONS

U.S. Application filed May 8, 2018, entitled Electronic Device Enclosures Having a Monolithic Appearance and assigned U.S. Appl. No. 15/974,185.

(Continued)

*Primary Examiner* — Alexander Gilman
(74) *Attorney, Agent, or Firm* — Kilpatrick Townsend & Stockton LLP

(57) ABSTRACT

An enclosure for an electronic device includes a housing having a wall that defines a cavity that is configured to receive an electronic assembly therein. The wall includes tongue formed at a distal end. A cover includes a top wall and a side surface extending from the top wall to form a chamber. The housing is at least partially received within the chamber and the tongue of the housing is welded to a groove positioned within the chamber. Flash from the weld is contained within the enclosure so that no weld flash is visible on the exterior surface of the enclosure.

14 Claims, 7 Drawing Sheets

(56) References Cited

U.S. PATENT DOCUMENTS

| | | | |
|---|---|---|---|
| 6,932,640 B1* | 8/2005 | Sung | H01R 4/2433 439/405 |
| 7,048,563 B2* | 5/2006 | Fukuda | H01R 13/5216 439/274 |
| 7,355,130 B2* | 4/2008 | Holman | H02G 3/088 16/2.1 |
| 7,922,540 B2* | 4/2011 | Zhang | H01R 13/68 439/106 |
| 7,947,901 B2* | 5/2011 | Leopold | H02G 3/088 174/50 |
| 8,013,242 B1* | 9/2011 | Thibault | H02G 3/185 174/481 |
| 8,708,722 B1* | 4/2014 | Walliser | H01R 13/6675 439/172 |
| 8,753,132 B2* | 6/2014 | Scritzky | H01R 24/30 439/106 |
| 9,312,670 B1* | 4/2016 | Baldwin | H02G 3/105 |
| 9,325,160 B2* | 4/2016 | Jolly | H02G 3/088 |
| 9,343,850 B2 | 5/2016 | Colahan et al. | |
| 9,412,489 B2* | 8/2016 | Adachi | H01R 13/5205 |
| 9,680,249 B2* | 6/2017 | Dvorak | H01R 13/504 |
| 9,882,302 B2 | 1/2018 | Kwan et al. | |
| 2005/0054239 A1* | 3/2005 | Su | H01R 13/4223 439/606 |
| 2005/0186857 A1* | 8/2005 | Sichner | H01R 13/514 439/717 |
| 2007/0293087 A1* | 12/2007 | Kennedy | H01R 13/405 439/606 |
| 2009/0029603 A1* | 1/2009 | Tokairin | H01R 13/405 439/736 |
| 2009/0059636 A1* | 3/2009 | Ho | H02J 7/34 363/146 |
| 2013/0078853 A1* | 3/2013 | Dinh | H02G 3/088 439/535 |
| 2014/0162480 A1* | 6/2014 | Schutte | H01R 13/447 439/142 |
| 2014/0308853 A1* | 10/2014 | Colahan | H01R 13/6675 439/628 |
| 2015/0255915 A1* | 9/2015 | Kao | H01R 24/28 439/606 |
| 2017/0093077 A1* | 3/2017 | Kwan | H01R 13/504 |

OTHER PUBLICATIONS

Extended European Search Report issued in European Application No. EP18196964.3, dated Feb. 26, 2019 in 8 pages.

First Examination Report issued in Australian Application No. AU2018101458, dated Dec. 14, 2018 in 5 pages.

* cited by examiner

DUAL CUP ENCLOSURE FOR ELECTRONIC DEVICES

CROSS-REFERENCES TO OTHER APPLICATIONS

This application claims priority to U.S. provisional patent application Ser. No. 62/678,684, for "DUAL CUP ENCLOSURE FOR ELECTRONIC DEVICES" filed on May 31, 2018 which is hereby incorporated by reference in entirety for all purposes.

FIELD

The described embodiments relate generally to enclosures that are made of two or more components and have an aesthetically pleasing and uniform interface where the components are joined together. More particularly, the present embodiments relate to plastic enclosures that house one or more electronics assemblies and include weld joints that are not visible from the exterior.

BACKGROUND

Currently there are a wide variety of electronic devices that have external enclosures to facilitate the use of the electronic device and provide an aesthetic appearance. However, often such enclosures have one or more seams where the plastic components of the enclosure are joined together. The external appearance of the seams can be difficult to uniformly control during high volume production and can sometimes result in a relatively weak region of the enclosure that is prone to damage and/or separation. This can be particularly problematic for enclosures that contain high-voltage electronic components that would be exposed if seam were broken and separated. New enclosures and new methods for joining enclosure components are needed so the enclosure seams are more uniform during production, are aesthetically pleasing and have improved structural integrity.

SUMMARY

Some embodiments of the present disclosure relate to enclosures for electronic devices. Various embodiments relate to plastic enclosures that are made from two or more components that are joined together with welded seams. The components can have nested structure where a tongue of an inner component is welded to a groove within an outer component such that the entire weld joint is hidden within the enclosure.

In some embodiments an enclosure for an electronic device comprises a housing including a bottom wall and at least one sidewall extending from the bottom wall to define a cavity, the at least one sidewall having a distal end portion. A cover is attached to the housing, where the cover includes: a top wall and at least one outer wall extending from the top wall to define a chamber, the at least one outer wall defining an aperture that is in communication with the chamber, a ridge extending from the top wall and into the chamber, and a groove defined between the at least one outer wall and the ridge, wherein at least a portion of the housing is received within the chamber such that the distal end portion of the at least one sidewall is aligned with and positioned within the groove.

In some embodiments the distal end portion is welded to the step and to the ridge. In various embodiments an interior surface of the at least one outer wall includes a step, wherein the step is positioned opposite and adjacent the ridge such that the step and the ridge define the groove. In some embodiments the step includes a plurality of segments distributed along a length of the outer wall with adjacent segments of the plurality of segments separated by a gap. In various embodiments a majority of the at least one sidewall is parallel to and adjacent the at least one outer wall.

In some embodiments an outer surface of the at least one sidewall includes a plurality of ribs. In various embodiments the enclosure further comprises an electronic assembly that is positioned within the cavity and is coupled to a plurality of electrical prongs that extend from an outside surface of the enclosure. In some embodiments the electronic assembly is an AC to DC converter that receives AC power through the plurality of electrical prongs and supplies DC power to an external electronic device. In some embodiments the enclosure further comprises a receiving opening formed in the top wall that enables the external electronic device to be electrically coupled to the electronic assembly.

In some embodiments an enclosure for an electronic device comprises a housing including a bottom wall and at least one sidewall extending from the bottom wall to define a cavity, the at least one sidewall having a distal end portion. A cover is attached to the housing, wherein the cover includes: a top wall and at least one outer wall extending from the top wall to define a chamber, the at least one outer wall defining an aperture that is in communication with the chamber, and a groove extending into an interior surface of the top wall, wherein at least a portion of the housing is received within the chamber such that the distal end portion of the at least one sidewall is aligned with and positioned within the groove.

In some embodiments the distal end portion is welded to a pair of parallel walls that form the groove. In various embodiments at least one wall of the pair of parallel walls includes a step that projects into the groove. In some embodiments the step is formed as a portion of the first wall of the pair of parallel walls, the step protruding into the groove and including a plurality of segments distributed along a length of the first wall, with adjacent segments of the plurality of segments separated by a gap.

In some embodiments an outer surface of the at least one sidewall includes a plurality of ribs. In various embodiments the enclosure further comprises an electronic assembly that is positioned within the cavity and is coupled to a plurality of electrical prongs that extend from an outside surface of the enclosure.

In some embodiments method of forming an electronic device comprises forming a housing including a bottom wall and at least one sidewall extending from the bottom wall to define a cavity, the at least one sidewall having a distal end portion. An electronic assembly is disposed within the cavity and a cover is formed. The cover includes: a top wall and at least one outer wall extending from the top wall to define a chamber wherein the at least one outer wall defines an aperture that is in communication with the chamber, a ridge extending from the top wall and into the chamber, and a groove defined between the at least one outer wall and the ridge. At least a portion of the housing is inserted through the aperture and into the chamber such that the distal end portion of the at least one sidewall is aligned with and positioned within the groove and the distal end portion of the at least one sidewall is attached to the at least one outer wall and the ridge.

In some embodiments the distal end portion is ultrasonically welded to the step and to the ridge. In various embodiments flash that is generated from the ultrasonic weld is contained entirely within an enclosure formed by the housing and the cover. In some embodiments an interior surface of the at least one outer wall includes a step wherein the step is positioned opposite and adjacent the ridge such that the step and the ridge define the groove. In some embodiments the step includes a plurality of segments distributed along a length of the outer wall with adjacent segments of the plurality of segments separated by a gap.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Some embodiments of this disclosure are directed to electronic enclosures that have two or more plastic components joined together at a seam or joint formed between the components. While the present disclosure can be useful for a wide variety of configurations, some embodiments of the disclosure are particularly useful for electronic enclosures that have an aesthetically appealing exterior surface and/or that enclose high voltage electronic assemblies that would be dangerous to a user if the enclosure separated, as described in more detail below.

For example, in some embodiments joining of the two or more plastic components can be performed with a process known in the art as ultrasonic welding. In various embodiments the joint is formed using an ultrasonically welded configuration that includes a nested structure where a tongue of an inner plastic component is welded to a groove within an outer plastic component such that the entire weld joint and any associated weld residue, also called "flash" herein, is hidden within the enclosure.

In some embodiments the tongue is welded to both sides of the groove, forming a "double shear" weld joint. The double shear weld joint balances applied forces during welding so stresses and deformation are equally distributed on each side of the tongue. As a result, the double shear joint can result in less distortion of the cover and housing during joining, may require less fixturing to keep the cover and housing from distorting during the joining process and may also form a stronger joint than a single sided shear joint. Further, since the double shear joint more evenly distributes stresses, the welding process can be more consistently controlled during high volume manufacturing resulting in a more consistent aesthetic appearance. Further, the dual wall "nested" structure of the housing and the cover results in a stronger enclosure that can be useful for protecting electronic assemblies that operate at high voltages and/or currents. These features and others will be described in more detail herein.

In order to better appreciate the features and aspects of plastic enclosures having a nested structure where a tongue of an inner component is welded to a groove within an outer component according to the present disclosure, further context for the disclosure is provided in the following section by discussing one particular implementation of an electronic enclosure according to embodiments of the present disclosure. These embodiments are for example only and other embodiments can be employed in other electronic devices such as, but not limited to wireless routers, wireless television devices, computers, watches, media players and other devices.

Figure 1:
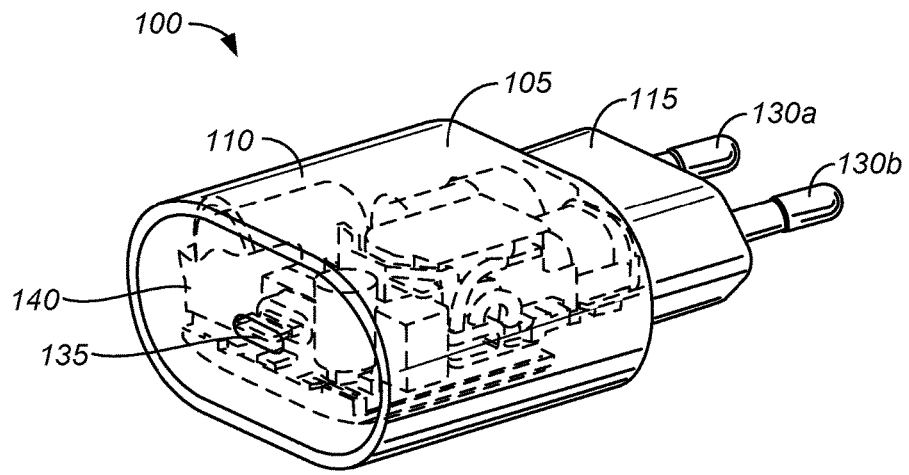
FIG. 1 is a front perspective view of an electronic device having an enclosure, according to some embodiments of the disclosure.

FIG. 1 illustrates a simplified perspective view of an electronic device 100 comprising an AC to DC adapter having an enclosure 105. As shown in FIG. 1, enclosure 105 can include a cover 110 positioned at least partially over and secured to a housing 115 with a tongue and groove double shear weld joint, as described in more detail below.

Housing, 115 has two electrical prongs 130a, 130b that extend away from the housing and are configured to be plugged into an AC wall outlet to receive AC power. Although two electrical prongs 130a, 130b illustrated in FIG. 1 are compatible with selected European receptacles, in other embodiments a different configuration of and/or number of prongs can be used that are compatible with other standards such as, but not limited to, United States, Japan and China. Cover 110 includes a receiving opening 135 that is configured to receive a mating connector. In some embodiments one or more double shear joints are formed between cover 110 and housing 115 and at least a portion of enclosure has a dual wall structure, as described in more detail below.

In some embodiments, enclosure 105 encases an AC to DC electronics assembly 140 that can receive electrical power (e.g., 120 Volts AC) electrical prongs 130a, 130b when the two electrical prongs are engaged with a wall receptacle. Electronics assembly 140 can be configured to transform the AC power received from the receptacle connector to DC power (e.g., 5 Volts DC) that can be supplied to an electronic computing device through a mating connector inserted in receiving opening 135, as described in more detail below.

Figure 2:
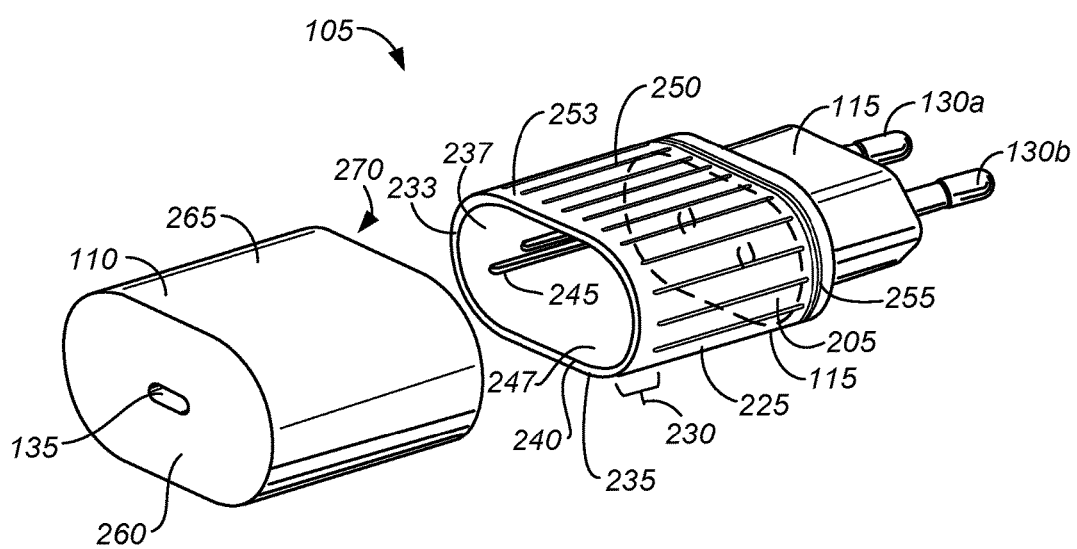
FIG. 2 is a partial exploded view of the enclosure shown in FIG. 1.

FIG. 2 illustrates a partial perspective view of housing 115 removed from cover 110. In some embodiments housing 115 includes a bottom wall 205 and at least one sidewall 225 extending from the bottom wall, the at least one sidewall having a distal end portion 230 forming a tongue 235. Distal end portion 230 is positioned at a distal end 233 of at least one sidewall 225. Bottom wall 205 and at least one sidewall 225 can form a cavity 237 having an opening 240 positioned opposite the bottom wall and sized to receive electronic assembly 140. One or more alignment features 245 can be positioned on an interior surface 247 of the one or more sidewalls 225 to align electronic assembly 140 within cavity 237. In some embodiments one or more alignment features 245 can include a pair of parallel ridges as shown in FIG. 2, while in other embodiments the one or more alignment features can be any type of protuberance from the interior surface 245 or a groove formed in the interior surface. One or more longitudinal ribs 250 can be positioned on an outer surface 253 of at least one sidewall 225 and one or more transverse ribs 255 can also be positioned on outer surface 253. In some embodiment one or more longitudinal ribs 250 and one or more transverse ribs 255 can provide alignment for cover 110 and/or add strength to enclosure 105, as described in more detail below.

FIG. 2 also illustrates cover 110 that can include a top wall 260 and at least one outer wall 265 extending from the top wall to form a chamber 270 that is sized to receive at least a portion of housing 115 through an aperture (identified as 403 in FIG. 4) that is positioned opposite the top wall. In some embodiments outer wall 265 of cover 110 is configured to slide over top of at least one sidewall 225 of the housing forming a dual wall structure, as shown in more detail below. A groove (not shown in FIG. 2) can be formed around an interior perimeter region of cover 110 and can receive and be joined to tongue 235 of housing 115 using ultrasonic welding, adhesive, solvent or other process. One or more longitudinal and transverse ribs, 250, 255, respectively can assist alignment of cover over and around housing 115. Receiving opening 135 in housing 215 is configured to align with a connector disposed within electronic assembly 140 (see FIG. 1). In some embodiments cover 110 can include an insert molded or separately formed top wall 260.

Figure 3:
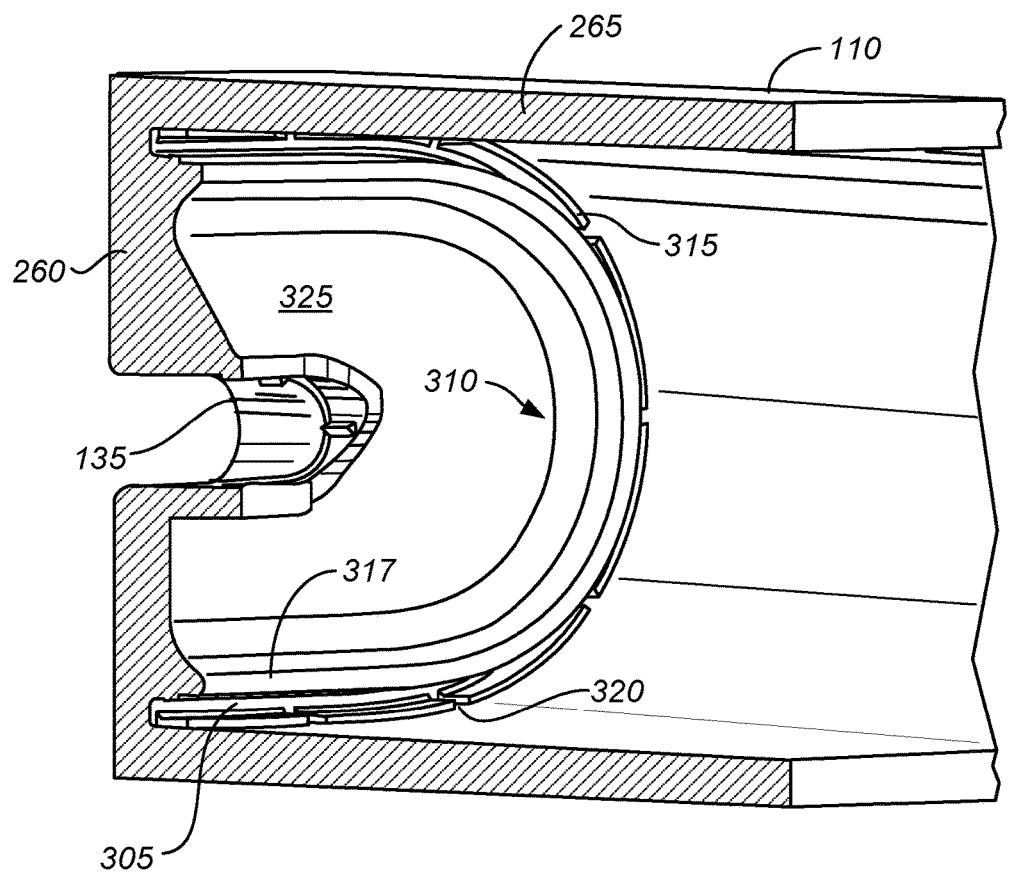
FIG. 3 is a partial perspective view of an interior portion of a cover of the enclosure shown in FIGS. 1 and 2.

FIG. 3 illustrates a cut away partial perspective view of the inside of cover 110. As shown in FIG. 3, in some embodiments cover 110 can include a groove 305 that is formed around an interior perimeter region 310. Groove 305 can be configured to mate with tongue 235 on housing 215 to form a double shear joint as described in more detail herein. In the embodiment illustrated in FIG. 3, groove 305 is formed from a step 315 and a ridge 317 that are spaced apart from one another. In some embodiments a wall can be used in place of ridge 317 and can extend from interior surface 325 of top wall 260. In further embodiments groove 305 can be formed into interior surface 325 of top wall 260. Myriad structures can be used to form groove 305 that receives tongue 235.

In some embodiments, step 315 can be formed as a portion of at least one outer wall 265, such that the at least one outer wall has a region of increased thickness (e.g., a step formed in the interior surface). In various embodiments step 315 can be discontinuous such that one or more recesses 320 can be formed in the first wall, breaking the first wall into segments. The one or more recesses 320 can be positioned to allow air to escape during the welding process and/or to allow weld residue "flash" to accumulate or exit. More specifically, as the double shear joint between tongue 235 and groove 305 is formed, the air volume within the tongue and groove joint decreases and is allowed to escape through one or more recesses 320. In the embodiment illustrated in FIG. 3 one or more recesses 320, also called gaps herein, are formed in step 315, however they can also or alternatively be formed deeper within ridge 317.

Figure 4:
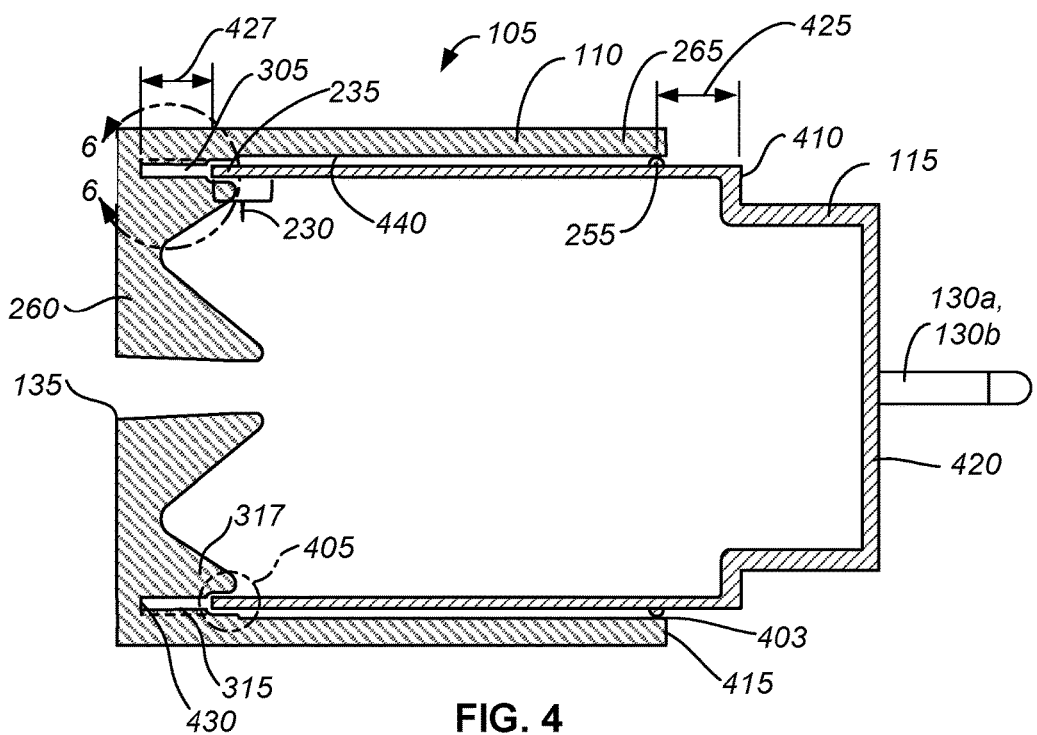
FIG. 4 is a partial cross-sectional view of an interface between the housing and the cover of the enclosure shown in FIGS. 1-3, before a welding process.
Figure 5:
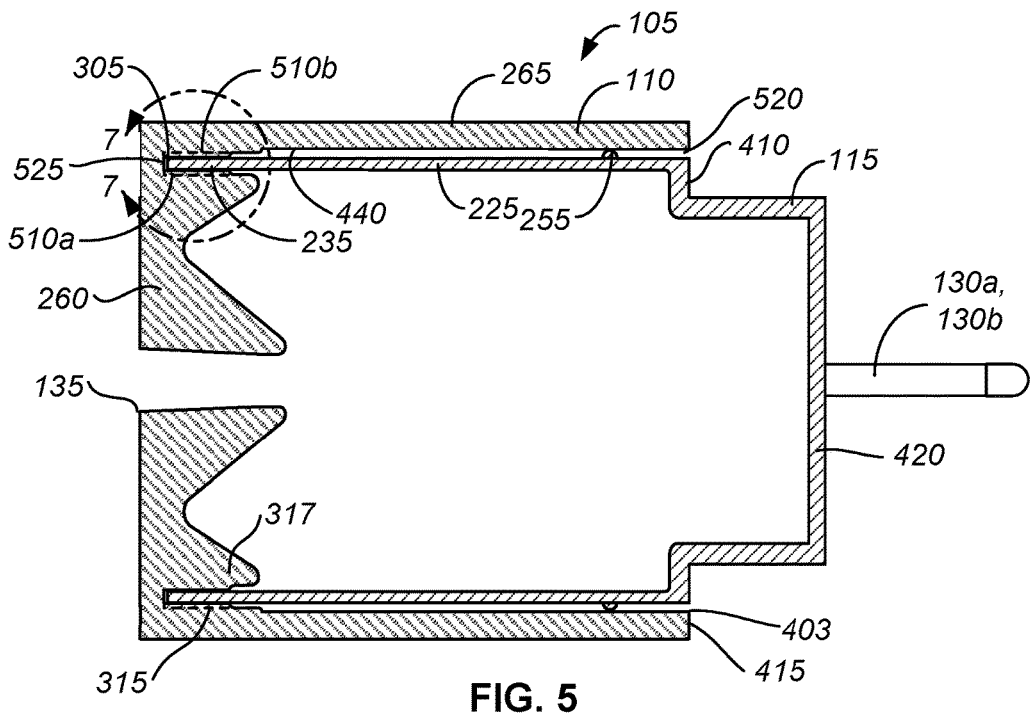
FIG. 5 is a partial cross-sectional view of the interface shown in FIG. 4 after the welding process.

FIGS. 4 and 5 illustrate cross-sections of housing 115 and cover 110 before and after the weld joint formation, respectively. As shown in FIG. 4, before the welding process, housing 115 is inserted through aperture 403 positioned at least partially within chamber 270 of cover 110, and tongue 235 is aligned with an entrance to groove 305. In various embodiments groove 305 can include an alignment region 405 that has a clearance fit for tongue 235 so the tongue aligns with groove 305 before the welding process is initiated. In one embodiment the clearance between tongue 235 and either side of groove 305 in alignment region 405 is between 20 and 100 microns.

In some embodiments transverse rib 255 can be positioned on housing 115 such that a distal end 415 of outer wall 265 of cover 110 is held in position (e.g., aligned symmetrically with housing 115) before the welding process. In one embodiment a first distance 425 from transverse rib 255 to edge of housing 410 is between 1.7 and 2.3 millimeters which is less than a second distance 427 from a distal end of tongue 235 to a bottom 430 of groove 305 such that the tongue will not bottom out in the groove before alignment is achieved between distal end 415 of cover 110 and edge of housing 410.

In some embodiments transverse rib 255 can be configured to contact an interior surface 440 of outer wall 265 while in other embodiments there may be gap between the transverse rib and the interior surface of outer wall. In yet further embodiments a spacer that can be a tape or other material can be placed between transverse rib and interior surface of cover 110. In some embodiments cover 110 can have one or more weld initiation zones (not shown in FIG. 4) that are small regions that rest on tongue 235 when housing 115 and cover 110 are in the position shown in FIG. 4. Bottom wall 420 of housing 115 can have one or more electrical connections that are coupled to prongs 130a, 130b as described in more detail below.

FIG. 5 illustrates housing 115 and cover 110 after the weld joint formation. As shown in FIG. 5, cover 110 has been positioned over a portion of housing 115 such that tongue 235 is substantially engaged in groove 305. In embodiments that employ ultrasonic welding, a pair of weld joints 510a, 510b have been formed on either side of tongue 235. Weld flash can collect in bottom portion 525 of groove 305. During welding air and/or flash can escape from groove 305 through one or more recesses 320 (see FIG. 3).

In embodiments that employ ultrasonic welding, the welding process involves applying high frequency (e.g., in the range of 10 kHz to 40 kHz) acoustic vibrations cover 110 and/or housing 115 that are held together under pressure to create a solid-state weld. Force can be applied to cover 110 and/or housing 115 to push them together during the welding process. The vibrations cause heat to be generated at the interfaces where tongue 235 and groove 305 are in contact with each other as a result of the friction between the surfaces. The heat causes localized regions of tongue 235 and groove 305 to melt and form weld joints 510a, 510b. At each of weld joints 510a, 510b flash is generated that is extruded out of the welds.

In this particular embodiment it can be seen that weld joints are contained entirely within enclosure 105 so that no weld flash or weld deformation can be seen on the exterior of the enclosure. The only joint observable from the exterior of enclosure 105 is a gap 520 between housing 115 and cover 110 that is not welded. In some embodiments, due to the balanced forces in the double shear welding and the nested structure of the enclosure, gap 520 can be consistently controlled during production resulting in a consistent aesthetically pleasing appearance for the enclosure. It can be further seen in FIG. 5 that a substantial portion of enclosure 105 has a dual wall structure where one or more sidewalls 225 are parallel to and spaced apart from one or more outer walls 265 forming a strong and reliable enclosure.

In other embodiments a joint can be formed between tongue 235 and groove 305 using a process other than ultrasonic welding. In one embodiment an adhesive, glue, solvent or other material can be used to bond tongue 235 to groove 305.

Figure 6:
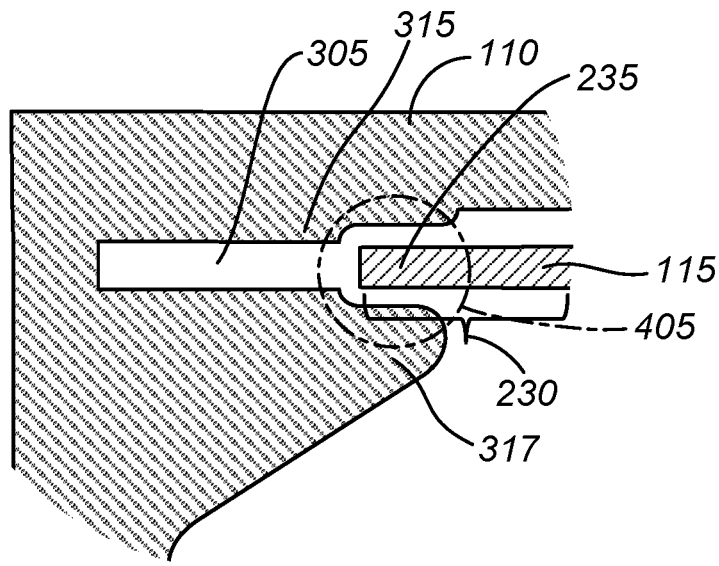
FIG. 6 is a partial cross-sectional close-up view of the weld region shown in FIG. 4, before the welding process.
Figure 7:
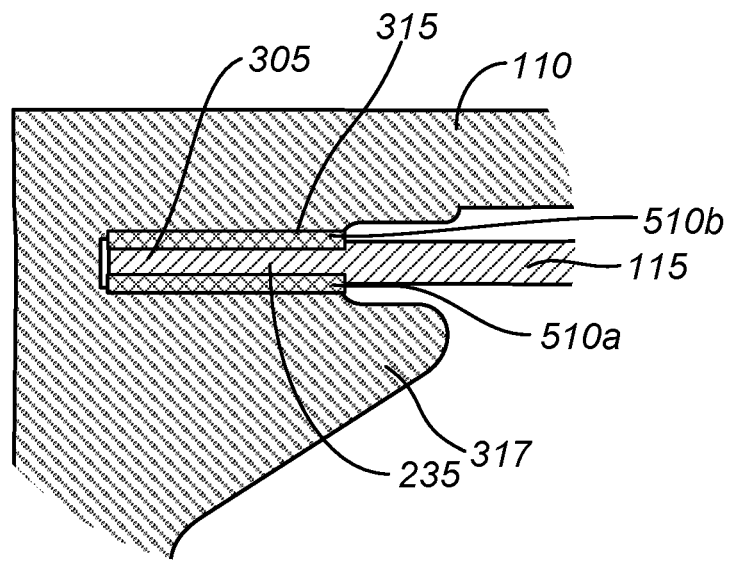
FIG. 7 is a partial cross-sectional close-up view of the weld region shown in FIG. 5 after the welding process.

FIGS. 6 and 7 show close-up cross-sections of housing 115 and cover 110 before and after the weld joint formation, respectively, when an ultrasonic welding process is used. As shown in FIG. 6 tongue 235 is aligned with an entrance to groove 305. In some embodiments groove 305 can have an alignment region 405 that has a clearance fit tongue 235 so the tongue aligns with the groove before the welding process is performed.

As shown in FIG. 7. tongue 235 has been welded to groove 305 forming a double shear joint. A pair of weld joints 510a, 510b have been formed on either side of tongue 235. Tongue 235 has been inserted into groove 305 during the welding process.

Figure 8:
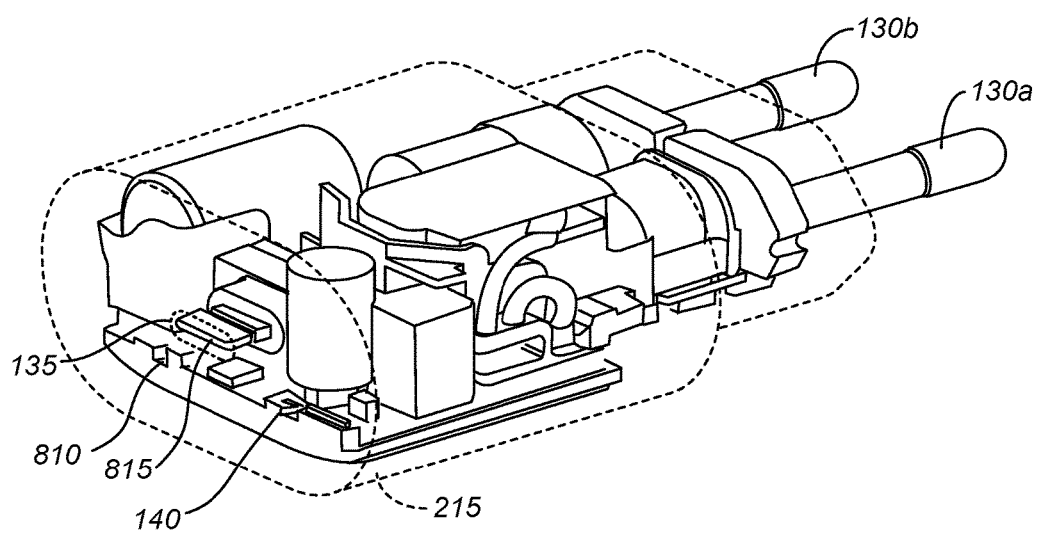
FIG. 8 is a front perspective view of the electronic device illustrated in FIGS. 1-7 showing the electronic assembly within the enclosure.

FIG. 8 illustrates electronic assembly 140 positioned within enclosure 105. In some embodiments electronic assembly 140 includes a substrate 810 that is aligned within housing using one or more alignment features 245 (see FIG. 2).

Figure 9:
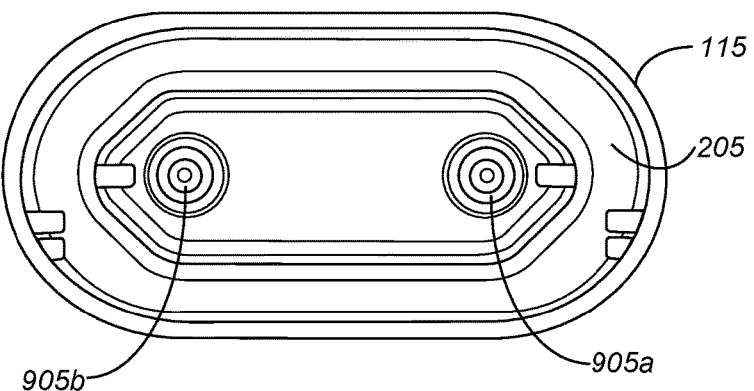
FIG. 9 is a top perspective view within the cavity of the housing of the enclosure shown in FIGS. 1-8.

FIG. 9 illustrates a view of an interior surface of bottom wall 205 of housing 115 showing termination regions 905a, 905b that are electrically coupled to corresponding prongs 130a, 130b (see FIG. 1). In some embodiments termination regions 905 are electrically conductive and make electrical contact with electronic assembly 805 (see FIG. 8) such that AC power can be received through prongs 130a, 130b and coupled to the electronic assembly through termination regions 905a, 905b. Electronic assembly 805 can convert the AC power to DC power and deliver DC power through connector 815 that can be accessed through receiving opening 135 (see FIG. 1).

Figure 10:
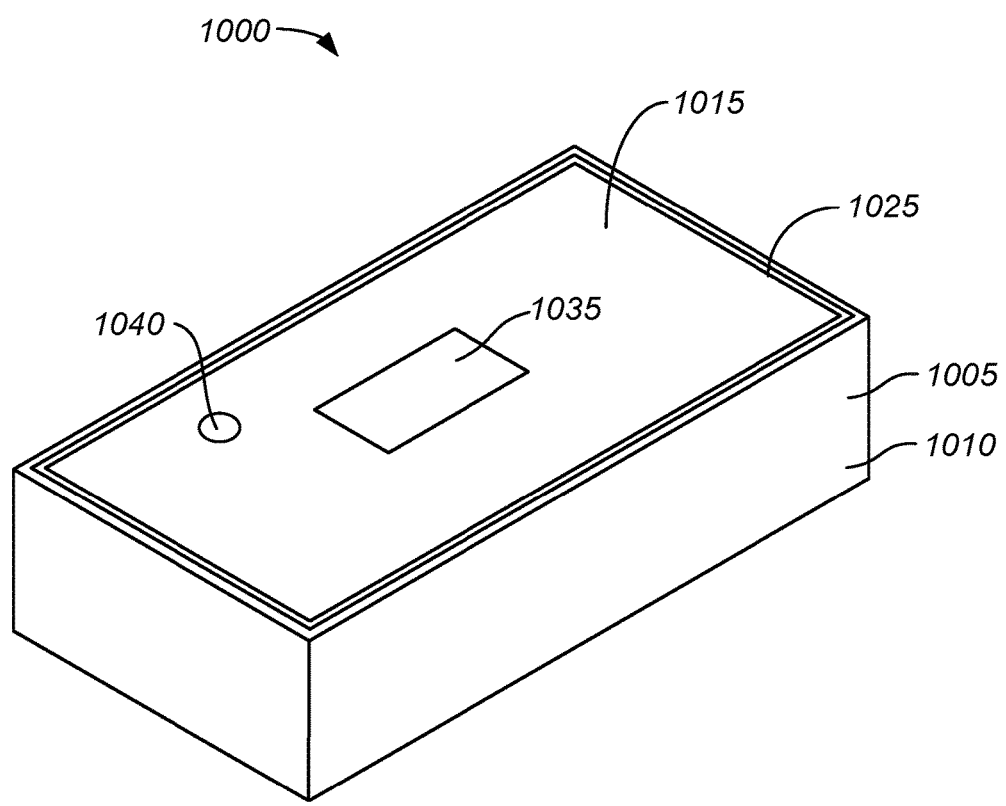
FIG. 10 is a top perspective view of an electronic device having an enclosure, according to some embodiments of the disclosure.

Weld joints formed between a tongue of an inner component and a groove formed within an outer component, such as weld joints 510a, 510b in FIGS. 1-9, can be used to join myriad other plastic components together when it is desired to have a strong enclosure equipped with a double shear weld joint that is free from externally visible flash. For example, FIG. 10 illustrates a simplified perspective view of an electronic device 1000, that can be used, for example, as an underwater diving device according to some embodiments of the disclosure. Electronic device 1000 can include an enclosure 1005 that is made from a cover 1010 joined to a housing 1015 with a double shear weld joint similar to that illustrated in FIGS. 1-9.

The weld joint can be formed within enclosure 1005 with a single shear joint having an integral flash trap as described in detail above in FIGS. 2 and 3. The double shear joint can result in less distortion of cover 1010 and housing 1015 and can exhibit improved strength as compared to other joints. The double shear weld joint can result in less distortion of cover 1010 and housing 1015 and can exhibit improved strength as compared to other weld joints. In some embodiments the weld joint can include a gap 1025 between housing 1015 and cover 1010 that is visible from the exterior. The double shear joint can be used to consistently control the size of gap 1025 during high volume manufacturing so each part is aesthetically consistent.

In the embodiment shown in FIG. 10, enclosure 1005 is illustrated as including a display 1035 (e.g., a touch display) and an input button 1040 however other embodiments can have different user interface features. Since enclosure 1005 can, in some embodiments, completely encompass the electronics assembly the electronic assembly within the enclosure can be inductively charged with a separate inductive charging station such that no penetrations are required through enclosure 1005 making the enclosure completely sealed such that it is liquid-tight. In further embodiments enclosure 1005 can have a battery or other power source within it. Embodiments of the disclosure are not limited to any particular electronic device. Embodiments of the disclosure are not limited to any particular electronic device. In some embodiments enclosure 1005 can be used for electronic devices that have different components and/or features than those shown in FIG. 10.

For example, in some embodiments enclosure 1005 can be used to enclose electronics assemblies such as, but not limited to, a smartphone, a tablet computer, a laptop or other type of computer, a watch, a wireless communication transceiver, a wireless router, an RFID device, a wirelessly activated tag for locating lost keys or an AC to DC adapter, as explained in more detail below. In one example, enclosure 1005 can be used to encase a wireless transceiver, a rechargeable battery and a wireless charging interface to charge an internal battery. The enclosure can be formed without penetrations through the enclosure so the internal electronic assembly is fully encased and protected from water, moisture, dust or other environmental contaminants.

In further embodiments, enclosure 1005 can be used for purposes other than enclosing an electronic device. In one example, enclosure 1005 can be used to form an aesthetically appealing enclosure for an antique (e.g., a coin or a piece of ancient artwork) that needs to be protected from damage and/or exposure to the environment. As would be recognized by one of skill in the art, a weld joint formed between two plastic components that are nested and joined together with a tongue and groove weld joint exhibiting no external flash on the exterior surface is useful for myriad of enclosures.

As defined herein, liquid-tight shall mean a seal that conforms to one or more of the following ratings as defined by the International Protection Rating and International Electrotechnical Commission (IEC) 60529 that can also be known as the I.P. 68 rating. In some embodiments the liquid-tight seal will protect the electronic assembly against the harmful ingress of water and have a "liquid ingress" rating between 1 (dripping water) and 8 (immersion beyond 1 meter). In various embodiments the liquid-tight seal shall be rated between 1 (dripping water) and 4 (splashing water) while in some embodiments the liquid-tight seal shall be rated between 2 (dripping water with device tilted at 15 degrees) and 5 (water jet). In various embodiments the liquid-tight seal shall be rated between 3 (spraying water) and 6 (powerful water jets) while in some embodiments the liquid-tight seal shall be rated between 4 (splashing water) and 7 (immersion up to 1 meter). In various embodiments the liquid-tight seal shall be rated between 5 (water jets) and 8 (immersion beyond 1 meter) while in some embodiments liquid-tight shall mean the seal will protect the electronic device against liquid ingress up to 100 feet for 30 minutes.

Figure 11:
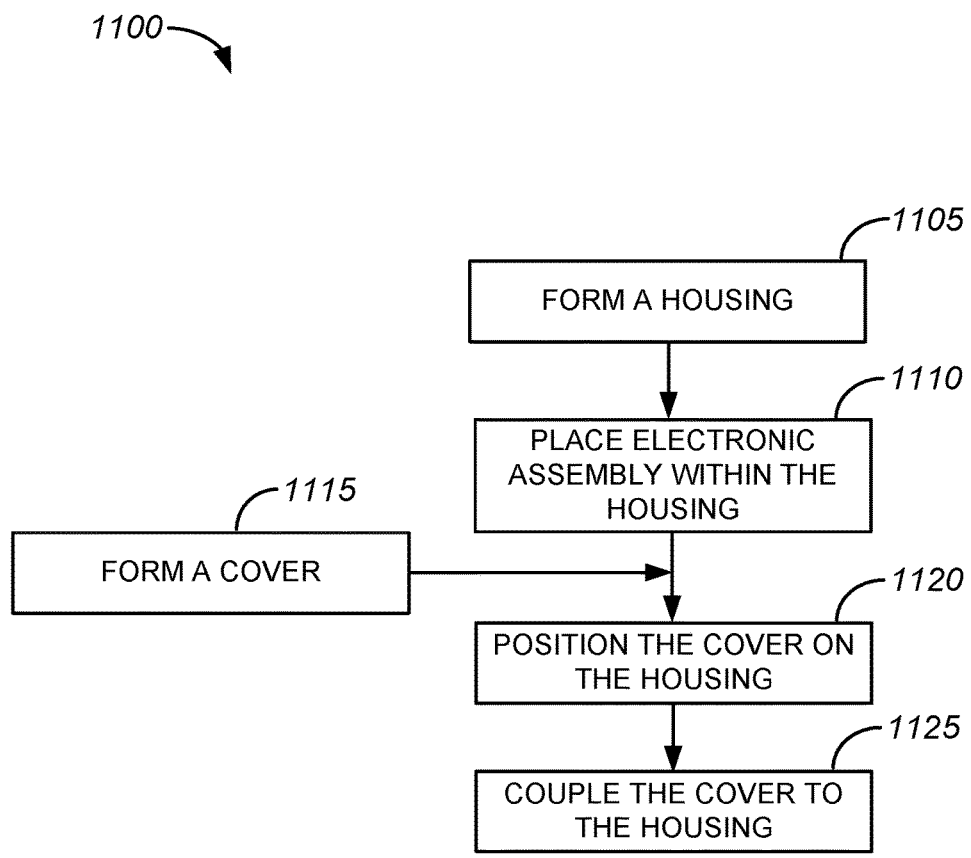
FIG. 11 is a flowchart depicting a process for forming an enclosure according to some embodiments of the disclosure.

FIG. 11 illustrates a method 1100 for making an enclosure such as enclosure 105 in FIG. 1-9 or 1005 in FIG. 10. In step 1105 a housing is formed. In one embodiment the housing can have a rear wall and one or more sidewalls that extend from the rear wall to form a cavity. In step 1110, an electronic assembly is placed within the cavity. In step 1115 a cover is formed. The cover can be formed prior to, simultaneously with or after the housing is formed in step 1105. In one embodiment the cover includes a top wall and one or more outer walls extending from the top wall to form a chamber with an opening positioned opposite the top wall. In step 1120 the cover is positioned on the housing such that tongue of the housing is aligned with a groove positioned inside the chamber. In step 1125 ultrasonic welding is performed between the cover and the housing, joining them together as one enclosure. The weld joint includes a double shear weld joint formed between the tongue and the two walls the form the groove. All weld flash is contained within the enclosure so no flash is visible on an exterior surface of the enclosure as described above.

Although electronic device 100 (see FIG. 1) is described and illustrated as one particular type of electronic device, embodiments of the disclosure are suitable for use with a myriad electronic devices. For example, any device that receives or transmits audio, video or data signals can be used with embodiments of the disclosure. In some instances, embodiments of the disclosure are particularly well suited for use with portable electronic media devices because of their potentially small form factor and need for aesthetically appealing enclosures.

As used herein, an electronic media device includes any device with at least one electronic component that can be used to present human-perceivable media. Such devices can include, for example, portable music players (e.g., MP3 devices and Apple's iPod devices), portable video players (e.g., portable DVD players), cellular telephones (e.g., smart telephones such as Apple's iPhone devices), video cameras, digital still cameras, projection systems (e.g., holographic projection systems), gaming systems, PDAs, as well as tablet (e.g., Apple's iPad devices), laptop or other mobile computers. Some of these devices can be configured to provide audio, video or other data or sensory output.

For simplicity, various internal components, such as the AC/DC converter circuitry, power transfer circuitry, internal connectors and other components of electronic devices 100 and 1000 (see FIGS. 1 and 10) are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. An enclosure for an electronic device comprising:
 a housing including a bottom wall and at least one sidewall extending from the bottom wall to define a cavity, the at least one sidewall having a distal end portion; and
 a cover attached to the housing, the cover including:
  a top wall and at least one outer wall extending from the top wall to define a chamber, the at least one outer wall defining an aperture that is in communication with the chamber;
  a ridge extending from the top wall and into the chamber; and
  a step positioned opposite and adjacent the ridge and extending from an interior surface of the outer wall, wherein the step includes a plurality of segments distributed along a length of the outer wall with adjacent segments of the plurality of segments separated by a gap;
  a groove defined between the at least one outer wall and the step, wherein at least a portion of the housing is received within the chamber such that the distal end portion of the at least one sidewall is aligned with and positioned within the groove.

2. The enclosure of claim 1 wherein the distal end portion is welded to the step and to the ridge.

3. The enclosure of claim 1 wherein a majority of the at least one sidewall is parallel to and adjacent the at least one outer wall.

4. The enclosure of claim 1 wherein an outer surface of the at least one sidewall includes a plurality of ribs.

5. The enclosure of claim 1 further comprising an electronic assembly that is positioned within the cavity and is coupled to a plurality of electrical prongs that extend from an outside surface of the enclosure.

6. The enclosure of claim 5 wherein the electronic assembly is an AC to DC converter that receives AC power through the plurality of electrical prongs and supplies DC power to an external electronic device.

7. The enclosure of claim 6 further comprising a receiving opening formed in the top wall that enables the external electronic device to be electrically coupled to the electronic assembly.

8. An enclosure for an electronic device comprising:
 a housing including a bottom wall and at least one sidewall extending from the bottom wall to define a cavity, the at least one sidewall having a distal end portion; and
 a cover attached to the housing, the cover including:
  a top wall and at least one outer wall extending from the top wall to define a chamber, the at least one outer wall defining an aperture that is in communication with the chamber;
  a step extending from an interior surface of the outer wall, wherein the step includes a plurality of segments distributed along a length of the outer wall with adjacent segments of the plurality of segments separated by a gap;
  a groove extending into an interior surface of the top wall and at least partially defined by the step, wherein at least a portion of the housing is received within the chamber such that the distal end portion of the at least one sidewall is aligned with and positioned within the groove.

9. The enclosure of claim 8 wherein the distal end portion is welded to a pair of parallel walls that form the groove.

10. The enclosure of claim 8 wherein an outer surface of the at least one sidewall includes a plurality of ribs.

11. The enclosure of claim 8 further comprising an electronic assembly that is positioned within the cavity and is coupled to a plurality of electrical prongs that extend from an outside surface of the enclosure.

12. A method of forming an electronic device, the method comprising:
   forming a housing including a bottom wall and at least one sidewall extending from the bottom wall to define a cavity, the at least one sidewall having a distal end portion;
   disposing an electronic assembly within the cavity;
   forming a cover including:
      a top wall and at least one outer wall extending from the top wall to define a chamber, the at least one outer wall defining an aperture that is in communication with the chamber;
      a step extending from an interior surface of the outer wall, wherein the step includes a plurality of segments distributed along a length of the outer wall with adjacent segments of the plurality of segments separated by a gap;
      a ridge extending from the top wall and into the chamber; and
      a groove defined between the step and the ridge;
   inserting at least a portion of the housing through the aperture and into the chamber such that the distal end portion of the at least one sidewall is aligned with and positioned within the groove; and
   attaching the distal end portion of the at least one sidewall to the step and the ridge.

13. The method of claim 12 wherein the distal end portion is ultrasonically welded to the step and to the ridge.

14. The method of claim 13 wherein flash that is generated from the ultrasonic weld is contained entirely within an enclosure formed by the housing and the cover.

* * * * *